(12) United States Patent
Wong et al.

(10) Patent No.: US 7,397,080 B2
(45) Date of Patent: Jul. 8, 2008

(54) NON-VOLATILE MEMORY

(75) Inventors: Wei-Zhe Wong, Tainan (TW);
Ching-Sung Yang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 35 days.

(21) Appl. No.: 11/306,093

(22) Filed: Dec. 15, 2005

(65) Prior Publication Data
US 2006/0289925 A1     Dec. 28, 2006

(30) Foreign Application Priority Data
Jun. 27, 2005     (TW)     .............................. 94121378 A

(51) Int. Cl.
*H01L 51/20*     (2006.01)
(52) U.S. Cl. .............................. 257/320; 257/E51.004
(58) Field of Classification Search .................. 257/316, 257/319, 320, E51.004
See application file for complete search history.

(56) References Cited

U.S. PATENT DOCUMENTS

| | | | | |
|---|---|---|---|---|
| 5,280,446 A | * | 1/1994 | Ma et al. ............... | 365/185.15 |
| 5,455,792 A | * | 10/1995 | Yi ......................... | 365/185.15 |
| 6,043,530 A | * | 3/2000 | Chang ..................... | 257/320 |
| 6,949,788 B2 | * | 9/2005 | Fujiwara et al. ......... | 257/314 |
| 7,214,579 B2 | * | 5/2007 | Widdershoven et al. ..... | 438/211 |

OTHER PUBLICATIONS

Article titled "A Novel Flash Memory Device with S Plit Gae Source Side Injection and ONO Charge Storage Stack (SPIN)" jointly authored by Chen et al., 1997 Symposium on VLSI Technology Digest of Technical Papers, pp. 63-64.
Article titled "A Novel 3 VOLTS-Only, Small Sector Erase, High Density Flash E PROM" jointly authored by Kianian et al., 1994 Symposium on VLSI Technology Digest of Technical Papers, pp. 71-72.

* cited by examiner

*Primary Examiner*—Thomas Dickey
*Assistant Examiner*—Victor A. Mandala, Jr.
(74) *Attorney, Agent, or Firm*—Jianq Chyun IP Office

(57) ABSTRACT

A non-volatile memory including at least a substrate, a memory cell and source/drain regions is provided. The memory cell is disposed on the substrate and includes at least a first memory unit and a second memory unit. Wherein, the first memory unit, from the substrate up, includes a floating gate and a first control gate. The second memory unit is disposed on a sidewall of the first memory unit and includes a charge trapping layer and a second control gate. The two source/drain regions are disposed in the substrate at both sides of the memory cell.

9 Claims, 7 Drawing Sheets

NON-VOLATILE MEMORY

CROSS-REFERENCE TO RELATED APPLICATION

This application claims the priority benefit of Taiwan application serial no. 94121378, filed on Jun. 27, 2005. All disclosure of the Taiwan application is incorporated herein by reference.

BACKGROUND OF THE INVENTION

1. Field of Invention

The present invention relates to a semiconductor device, and particularly to a non-volatile memory (NVM), a manufacturing method and an operating method thereof.

2. Description of the Related Art

Among various types of non-volatile memory products, electrically erasable programmable read only memory (EE-PROM) is a memory device that has been widely used in personal computers and electronic equipment. Data can be stored, read out or erased from the EEPROM many times and stored data are retained even after power supplying the devices is cut off.

The floating gate and the control gate in a typical EEPROM are made of doped polysilicon. By applying bias voltages to the control gate and a source/drain region thereof, the EEPROM operates. When erasing data in the EEPROM however, it is likely to over-erase, which leads to misjudgment of data. In addition, to follow the trend of high integrity in the current semiconductor industry, the memory size becomes smaller, with shorter channel length. Therefore, when programming the memory cell, an abnormal punch-through phenomenon occurs between a drain region and a source region, which has an adverse impact on the electrical performance of the memory.

For other non-volatile memories of the prior art, a silicon nitride layer, instead of a polysilicon floating gate, is used to form an ONO composite layer (oxide-nitride-oxide composite layer). Such a device is referred to as a SONOS device (silicon-oxide-nitride-oxide-silicon device). Since the silicon nitride is able to capture electrons, the electrons injected in the silicon nitride layer would not be evenly distributed in the whole layer. Instead, the injected electrons concentrate on local regions of the silicon nitride layer. By changing the applied voltages on the control gate and the source/drain regions at both sides of the control gate, at the left side and the right side of a memory in a layer made of single silicon nitride material, 1-bit is stored, respectively. In this way, the non-volatile memory for storing 2 bits/cell is formed.

The memory cells still face the challenge of higher integrity of memory cell and shorter channel length. Under such situation, the two 1-bits of a memory cell would affect each other, so that two charge-distribution curves corresponding to the two 1-bits get broader, even merge together to generate a so-called second bit effect. As a result, when erasing data, the distribution curve formed by injected hot holes in the silicon nitride layer is not able to overlap with the electron-distribution curve, which leads to incomplete erasing and longer erasing time. This problem results in a slow operating speed and poor efficiency, even lower reliability.

It can be concluded that a non-volatile memory capable of storing multiple bits in a single memory cell without the second bit effect, over-erase and punch-through is desired in the related semiconductor manufactures.

SUMMARY OF THE INVENTION

In view of the above described, an object of the present invention is to provide a non-volatile memory capable of storing multi-bit data in a single memory cell without the second bit effect.

Another object of the present invention is to provide a manufacturing method of the non-volatile memory suitable for fabricating memories with simple process and without punch-through problems.

Still another object of the present invention is to provide an operating method with higher operation efficiency, lower applied voltage, less power consumption and faster operation speed.

The present invention provides a non-volatile memory, which includes at least a substrate, memory cells and source/drain regions. The memory cell is disposed on the substrate and includes a first memory unit and a second memory unit. Wherein, the first memory unit, from the substrate up, includes at least a floating gate and a first control gate. The second memory unit is disposed on one sidewall of the first memory unit and, from the substrate up, includes a charge trapping layer and a second control gate. The source/drain region is disposed on the substrate at both sides of memory cells.

According to the non-volatile memory described in the embodiment of the present invention, the second memory unit includes a charge trapping structure containing a charge trapping layer. The charge trapping structure is disposed between the second control gate and the substrate and extends between the second control gate and the first memory unit.

According to the non-volatile memory described in the embodiment of the present invention, the charge trapping structure, from the substrate up, includes, for example, a tunneling dielectric layer, a charge trapping layer and a barrier dielectric layer. Wherein, the charge trapping layer is made of, for example, silicon nitride.

According to the non-volatile memory described in the embodiment of the present invention, a dielectric layer is between the floating gate and the substrate. An inter-gate dielectric layer is between the first control gate and the floating gate. The inter-gate dielectric layer is made of, for example, oxide-nitride-oxide (ONO, i.e. a composite of silicon oxide-silicon nitride-silicon oxide).

According to the non-volatile memory described in the embodiment of the present invention, the floating gate is made of, for example, doped polysilicon; the first control gate and the second control gate are made of, for example, doped polysilicon.

The non-volatile memory of the present invention combining a first memory unit and a second memory unit is able to avoid second bit effect in the conventional EEPROMs and capable of storing two bits in a single memory cell.

The present invention provides a manufacturing method of the non-volatile memory. At first, a substrate is provided. Next, a first memory unit is formed on the substrate, wherein the first memory unit, from the substrate up, includes a dielectric layer, a floating gate, an inter-gate dielectric layer and a first control gate. Further, a charge trapping structure is formed on the substrate and a conductive layer is then formed on the substrate. Furthermore, the partial conductive layer is removed to form a second control gate on a sidewall of the first memory unit. The second control gate and the charge trapping structure together form a second memory unit. Then, at a side of the first memory not adjacent to the second memory unit and at a side of the second memory unit not adjacent to the first memory unit, two doping regions are formed, respectively.

According to the manufacturing method of the non-volatile memory in the embodiment of the present invention, prior to the step of forming a first memory unit, an N-type well region can be further formed in the substrate. To match the N-type well region, the above-mentioned two doping regions are P-type doping regions.

According to the manufacturing method of the non-volatile memory in the embodiment of the present invention, the above-mentioned charge trapping structure, from the substrate up, includes a tunneling dielectric layer, a charge trapping layer and a barrier dielectric layer. The charge trapping layer is made of, for example, silicon nitride.

According to the manufacturing method of the non-volatile memory in the embodiment of the present invention, the above-mentioned step for removing the partial conductive layer includes, for example, the sub-steps as follows. First, the charge trapping layer is used as an etching stop layer first to self-aligned etch the conductive layer to form the side wall spacers on both sides of the first memory unit. Next, a patterned photoresist layer is formed on the substrate for covering the conductive layer on the one sidewall of the first memory unit. Further, the patterned photoresist layer is used as a mask to remove the exposed part of the conductive layer. The method for removing the exposed part of the conductive layer includes non-isotropic etching process.

In the manufacturing method of the non-volatile memory, due to different etching selection ratios between the charge trapping structure and the conductive layer, the charge trapping structure can serve as a self-alignment mask to remove the conductive layer on the first memory unit, which simplifies the process and prevents the memory from punch-through.

The present invention provides an operating method of P-type channel memories. The P-type channel memory includes an N-type well region, memory cells, a first source/drain region and a second source/drain region. The N-type well region is disposed in the substrate. The memory cells are disposed on the N-type well region. Each of the memory cells includes a first memory unit and a second memory unit disposed on a sidewall of the first memory unit. The first memory unit, from the substrate up, includes at least a floating gate suitable for storing a first bit and a first control gate. The second memory unit, from the substrate up, includes at least a charge trapping layer suitable for storing a second bit and a second control gate. The first source/drain region and the second source/drain region are disposed at both sides of the N-type well region, respectively. The operating method includes following operations.

In the programming operations, a first voltage and a second voltage are applied to the first source/drain region and the second source/drain region, respectively and a third voltage and a fourth voltage are applied to the first control gate and the second control gate, respectively. In addition, a fifth voltage is applied to the N-type well region. Wherein, the third voltage is larger than the first voltage, so that the band gap between valance band and conduction band is used to induce a hot-electron injection effect, by which the electrons are injected to the floating gate where a first bit is stored.

According to the operating method of the non-volatile memory in the embodiment of the present invention, the first voltage is a negative voltage, while the third voltage is a positive voltage. The first volt is about −5V, the second voltage is about 0V, the third voltage is about 6V, the fourth voltage is about 0V and the fifth voltage is about 0V.

According to the operating method of the non-volatile memory in the embodiment of the present invention, during the above-mentioned programming operations, the method further includes applying the first voltage to the first source/drain region, applying the second voltage to the second source/drain region, applying a sixth voltage to the first control gate, applying a seventh voltage to the second control gate and applying the fifth voltage to the N-type well region. Wherein, the seventh voltage is larger than the first voltage and the first voltage is larger than the sixth voltage, so that channel hot-holes are used to induce hot-electron injection effect, by which the electrons are injected to the charge trapping layer where a second bit is stored.

According to the operating method of the non-volatile memory in the embodiment of the present invention, the above-mentioned sixth voltage is about −12V and the seventh voltage is about −1V.

According to the operating method of the non-volatile memory in the embodiment of the present invention, during the above-mentioned erasing operations, an eighth voltage is applied to the second source/drain region, a ninth voltage and a tenth voltage are applied to the first control gate and the second control gate, respectively, and an eleventh voltage is applied to the N-type well region for floating the first source/drain region. Wherein, the ninth voltage and the tenth voltage are less than the eleventh voltage, so that a FN tunneling effect is used for inducing the electrons stored in the floating gate and the charge trapping layer into the N-type well region.

According to the operating method of the non-volatile memory in the embodiment of the present invention, the above-mentioned eighth voltage is about 0V, the ninth voltage is about −15V, the tenth voltage is about −15V, and the eleventh voltage is about 0V.

According to the operating method of the non-volatile memory in the embodiment of the present invention, during the above-mentioned reading operations, a twelfth voltage and a thirteenth voltage are applied to the first source/drain region and the second source/drain region, respectively, a fourteenth voltage and a fifteenth voltage are applied to the first control gate and the second control gate, respectively and a sixteenth voltage is applied to the N-type well region. Wherein, the fifteenth voltage is less than the fourteenth voltage, the fourteenth voltage is less than the thirteenth voltage, so as to open a channel below the second memory unit for reading the first bit in the floating gate.

According to the operating method of the non-volatile memory in the embodiment of the present invention, the above-mentioned twelfth voltage is about 0V, the thirteenth voltage is about −1.5V, the fourteenth voltage is about −3V, the fifteenth voltage is about −6V and the sixteenth voltage is about 0V.

According to the operating method of the non-volatile memory in the embodiment of the present invention, during the above-mentioned reading operations, the method further includes, applying the twelfth voltage and the thirteenth voltage to the first source/drain region and the second source/drain region, respectively, applying a seventeenth voltage and an eighteenth voltage to the first control gate and the second control gate, respectively and applying the sixteenth voltage to the N-type well region. Wherein, the seventeenth voltage is less than the eighteenth voltage and the eighteenth voltage is less than the thirteenth voltage, so as to open a channel below the first memory unit for reading the second bit in the charge trapping layer.

According to the operating method of the non-volatile memory in the embodiment of the present invention, the above-mentioned seventeenth voltage is about −6V and the eighteenth voltage is about −3V.

In the operating method of the non-volatile memory, the adopted operation mode for programming and erasing has a higher efficiency and is capable of injecting and pulling out the electrons more quickly. Therefore, the operation voltage on the memory is reduced, the power consumption is lowered and the device operation speed is advanced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1:
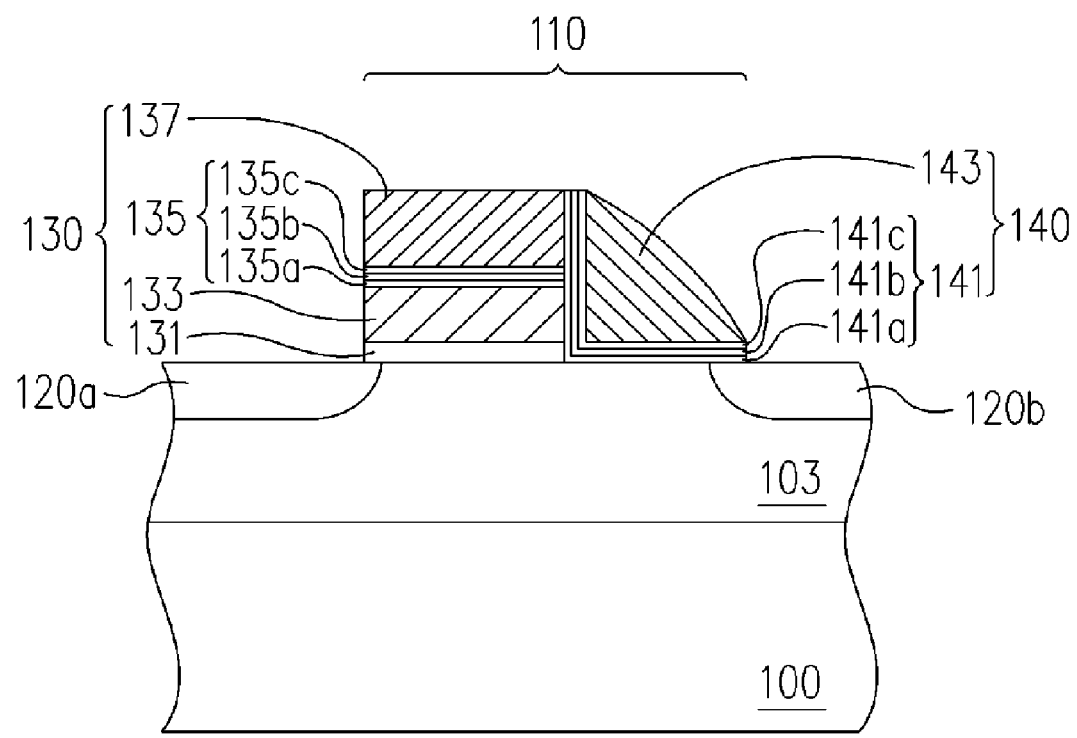
FIG. 1 is a schematic structural cross-sectional view of a non-volatile memory in an embodiment of the present invention.

FIG. 1 is a schematic structural cross-sectional view of a non-volatile memory in an embodiment of the present invention.

Referring to FIG. 1, the non-volatile memory includes at least a substrate 100, memory cells 110 and source/drain regions 120a and 120b. The memory cell 110 is disposed on the substrate 100 and includes at least a memory unit 130 and another memory unit 140. Wherein, the memory unit 130, from the substrate 100 up, includes at least a tunneling dielectric layer 131, a floating gate 133, an inter-gate dielectric layer 135 and a control gate 137. The memory unit 140 is disposed on a sidewall of the memory unit 130. The memory unit 140 includes, for example, a control gate 143 and a charge trapping structure 141. The control gate 143 is disposed on a sidewall of the memory unit 130 and the charge trapping structure 141 is disposed between the control gate 143 and the memory unit 130, and between the control gate 143 and the substrate 100. The source/drain regions 120a and 120b are disposed in the substrate at both sides of the memory cell 110.

The substrate 100 is, for example, a P-type substrate, wherein an N-type well region 103 is further disposed and together with the P-type doped source/drain regions 120a and 120b forms a P-type channel non-volatile memory.

The tunneling dielectric layer 131 in the memory unit 130 is made of, for example, silicon oxide. The floating gate 133 is made of, for example, doped polysilicon or other conductive materials. The control gate 137 is made of, for example, doped polysilicon, metal, metal silicide, or other conductive materials. Wherein, the inter-gate dielectric layer 135 can be a composite dielectric layer including, from down to up, a silicon oxide layer 135a, a silicon nitride layer 135b and a silicon oxide layer 135c. Certainly, the inter-gate dielectric layer 135 can only include the silicon oxide layer 135a and the silicon nitride layer 135b, even only include the single silicon oxide layer 135a. That is, as long as the material of the inter-gate dielectric layer 135 is a proper dielectric material capable of preventing the electrons stored in the floating gate 133 from entering the control gate 137, it is proper. The floating gate 133 of the memory unit 130 is used for storing charges and saving 1-bit data.

The control gate 143 of the memory unit 140 is made of, for example, doped polysilicon, metal, metal silicide, or other conductive materials. The charge trapping structure 141 in the memory unit 140, from the substrate up, includes, for example, a tunneling dielectric layer 141a, a charge trapping layer 141b and a barrier dielectric layer 141c. The tunneling dielectric layer 141a is made of, for example, silicon oxide. The charge trapping layer 141b is made of, for example, silicon nitride. The barrier dielectric layer 141c is made of, for example, silicon oxide. Alternatively, the tunneling dielectric layer 141a and the barrier dielectric layer 141c can be made of other similar materials. While the charge trapping layer 141b can be made of other materials capable of trapping charges hereinto, such as tantalum oxide ($Ta_2O_5$), strontium titanate ($SrTiO_3$), hafnium oxide ($HfO_2$), and so on, not limited to the above-mentioned silicon nitride. The charge trapping layer 141b has the characteristic of trapping charges hereinto, so that the memory unit 140 in the memory cell 110 can be used for storing 1-bit data as well.

In the non-volatile memory, the memory unit 130 and the memory 140 are connected in series to each other and any one of the memory units can be used for selecting the gate. By opening or closing a channel under the chosen memory unit, the punch through problem in a conventional EEPROM can be solved. Besides, the memory unit 130 and the memory unit 140 can store 1-bit data, respectively, such that the non-volatile memory of the present invention is the 2 bits/cell structure. Furthermore, different from the silicon nitride ROM (read-only memory) having a conventional 2 bits/cell structure, in the present invention, two bits are stored in two different structures, respectively. Hence, the second bit effect would not occur, which leads to enhanced efficiency and higher reliability.

For the manufacturing method of the non-volatile memory, please refer to FIGS. 2A-2E, schematic cross-sectional views showing a flowchart of fabricating a non-volatile memory in an embodiment of the present invention.

Figure 2A:
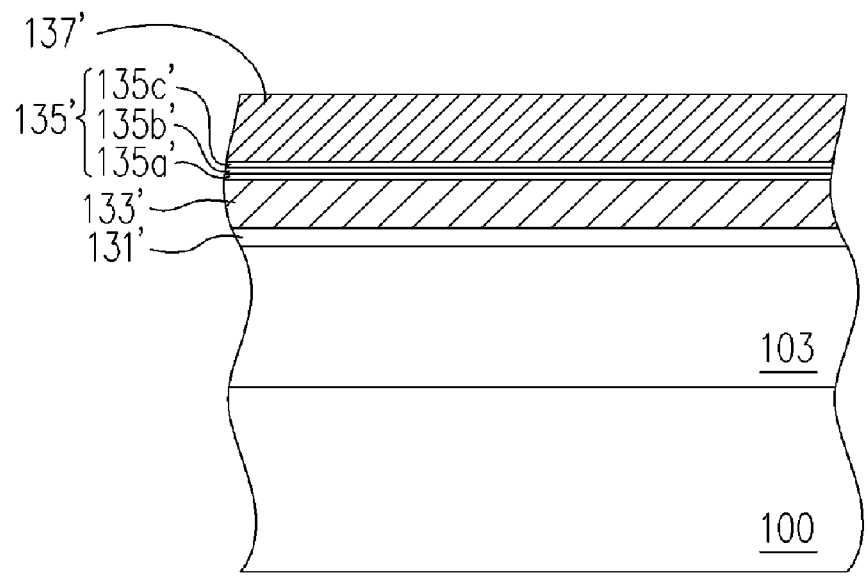
FIG. 2A-FIG. 2E are schematic cross-sectional views showing a flowchart of fabricating a non-volatile memory in an embodiment of the present invention.

Referring to FIG. 2A, first, a substrate 100 is provided and the substrate 100 is, for example, a P-type substrate. Next, an isolation structure (not shown) is formed on the substrate 100. After that, an N-type well region 103 is formed on the substrate 100. The method for forming the N-type well region 103 is, for example, by doping N-type dopant into the substrate 100 in a dopant diffusion process or dopant implanting process.

Further, on the substrate 100, a dielectric material layer 131', a conductive material layer 133', a dielectric material layer 135' and a conductive material layer 137' are formed sequentially. The dielectric material layer 131' is made of, for example, silicon oxide and formed, for example, in a thermal oxidizing process. The conductive material layer 133' is made of, for example, doped polysilicon and formed, for example, in a chemical vapor deposition (CVD) process. Since the conductive material layer 133' is used as the floating gate 133 afterwards, after forming the conductive material layer 133', a patterning step is performed, then the dielectric material layer 135' and the conductive material layer 137' are formed.

The conductive material layer 137' is made of, for example, doped polysilicon and formed in a chemical vapor deposition (CVD) process. Certainly, the conductive material layers 133' and 137' can also be made of metal, metal silicide or other proper conductive materials and are formed, for example, in a physical vapor deposition (PVD) process. The dielectric material layer 135', from the bottom to the top, includes, for example, a silicon oxide layer 135a', a silicon nitride layer 135b' and a silicon oxide layer 135c'. The silicon oxide layers 135a' and 135c' are formed, for example, in a chemical vapor deposition (CVD) process, and the silicon nitride layer 135b' is also formed, for example, in a chemical vapor deposition (CVD) process. The dielectric material layer 135' in the embodiment is made of composite dielectric layer for an explanatory purpose only. Since the dielectric material layer 135' is as an intermediate layer for forming an inter-gate dielectric layer 135 in the following step, the dielectric material layer 135' can also be other proper dielectric materials, such as silicon oxide or oxide-nitride, depending on design requirements.

Figure 2B:
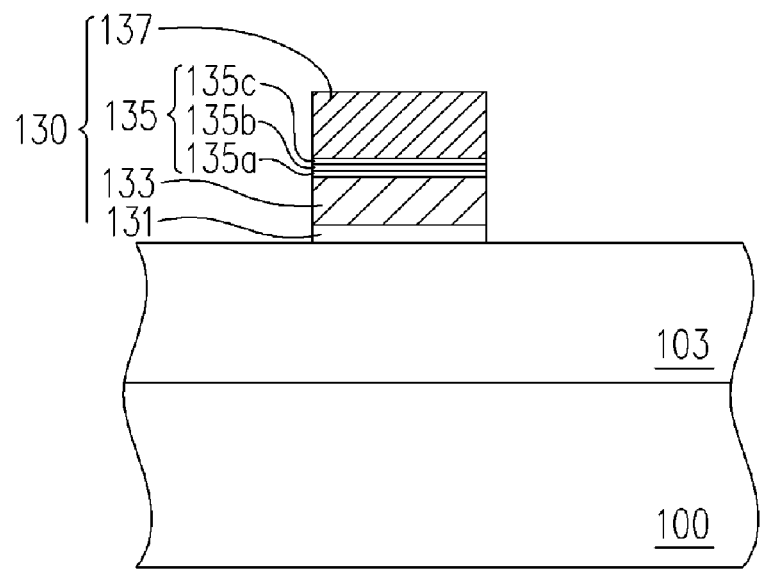

Furthermore, referring to FIG. 2B, the dielectric material layer 131', the conductive material layer 133', the dielectric material layer 135' and the conductive material layer 137' are patterned to form the memory unit 130. The method for patterning the above-mentioned layers is described, for example, as follows. On the conductive material layer 137', a patterned photoresist layer is formed (not shown). Taking the patterned photoresist layer as a mask, a non-isotropic etching process is performed, so that a control gate 137, an inter-gate dielectric layer 135 (a silicon oxide layer 135c, a silicon nitride layer 135b and a silicon oxide layer 135a), a floating gate 133 and a tunneling dielectric layer 131 are defined. Wherein, after conducting two lithography etching processes, the conductive material layer 133' becomes a block-like floating gate 133. The floating gate 133 in the memory unit 130 serves for storing charges.

Figure 2C:
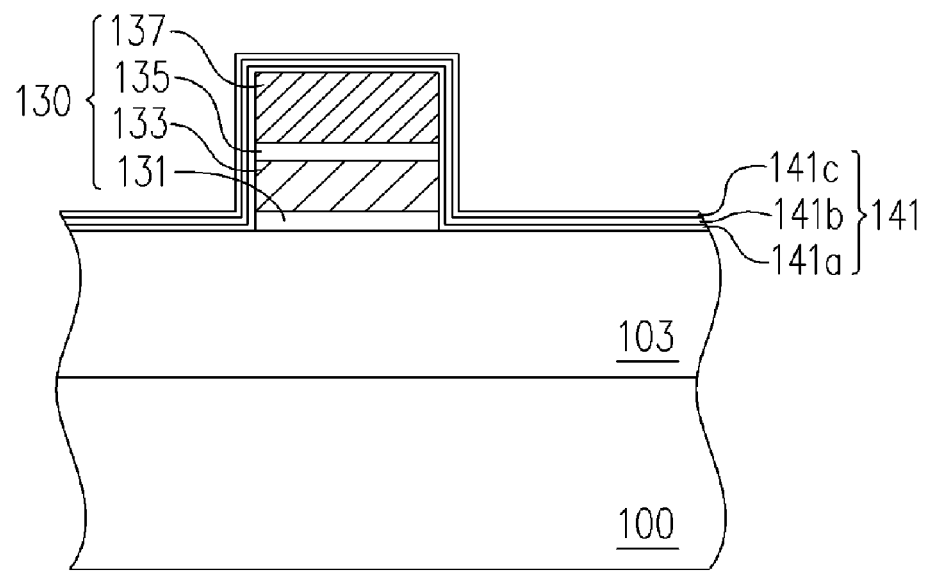

Then, referring to FIG. 2C, a charge trapping structure 141 is formed on the memory unit 130. The charge trapping structure 141, from the substrate 100 up, includes, for example, a tunneling dielectric layer 141a, a charge trapping layer 141b and a barrier dielectric layer 141c. The tunneling dielectric layer 141a is made of, for example, silicon oxide and formed, for example, in a chemical vapor deposition (CVD) process. The charge trapping layer 141b is made of, for example, silicon nitride and formed, for example, in a chemical vapor deposition (CVD) process. The barrier dielectric layer 141c is made of, for example, silicon oxide and formed, for example, in a chemical vapor deposition (CVD) process. In addition, the tunneling dielectric layer 141a and the barrier dielectric layer 141c can be made of other similar materials. The charge trapping layer 141b is made of, but not limited to, silicon nitride and can be other materials capable of trapping charges hereinto, such as tantalum oxide ($Ta_2O_5$), strontium titanate ($SrTiO_3$) or hafnium oxide ($HfO_2$).

Figure 2D:
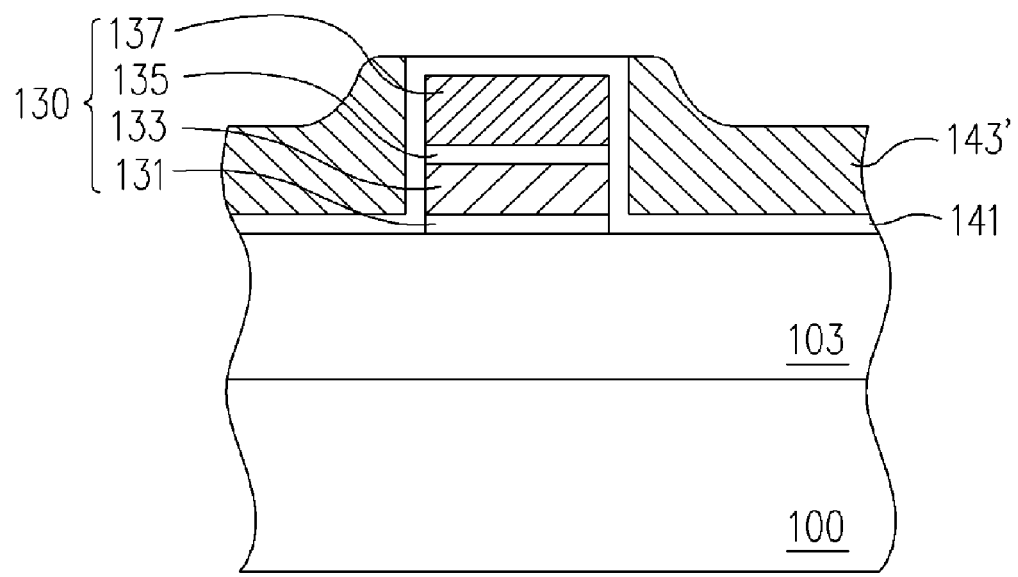

Afterwards, referring to FIG. 2D, a conductive material layer 143' is formed on the substrate 100. The conductive material layer 143' is made of, for example, doped polysilicon. To form the conductive material layer 143', for example, an undoped polysilicon layer is formed in a chemical vapor deposition (CVD) process, followed by an ion implanting process. Alternatively, the conductive material layer can be formed in an in-situ doped method and chemical vapor deposition (CVD) process. The conductive material layer 143' can be made of other proper conductive materials, such as metal as well, and formed in other different methods, depending on the materials. Then, the charge trapping layer 141 is used as an etching stop layer first to self-aligned etch the conductive material layer 143' to form the side wall spacers on both sides of the memory unit 130. Since the charge trapping structure 141 has an etching selection ratio different from that of the conductive material layer 143', the charge trapping structure 141 can be taken as an etching stop layer for etching the conductive material layer 143'.

Figure 2E:
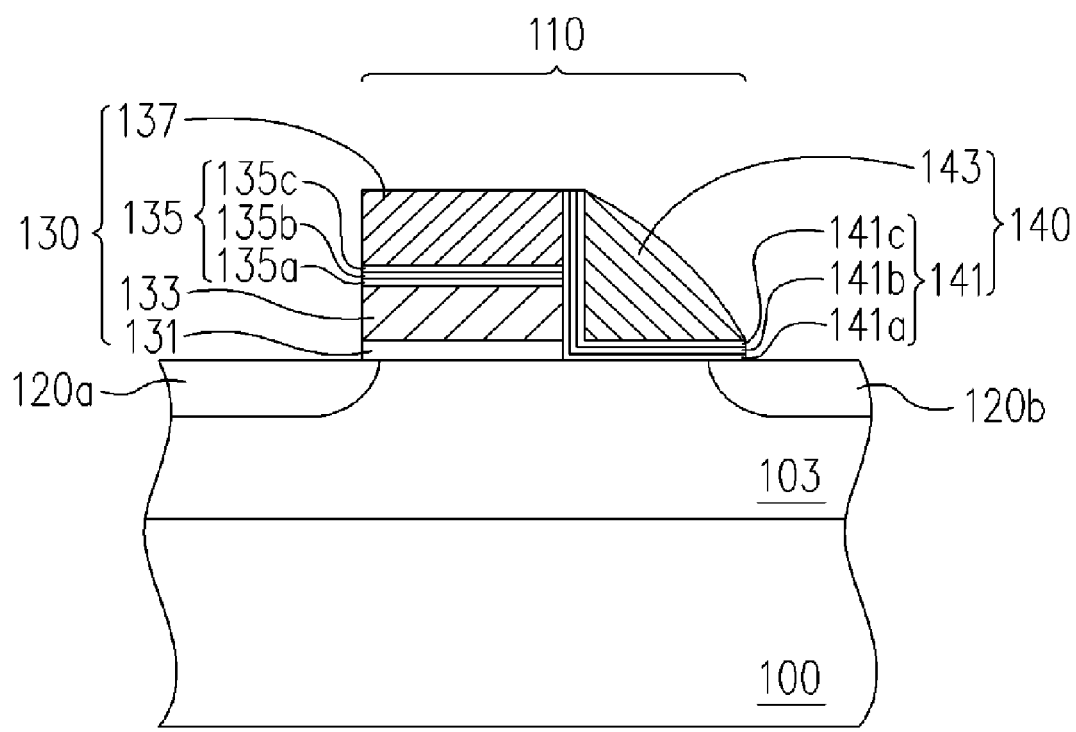

Thereafter, referring to FIG. 2E, the conductive material layer 143' is patterned to form a control gate 143 on a sidewall of the memory unit 130. To pattern the conductive material layer 143', for example, a patterned photoresist layer (not shown) is formed on the conductive material layer 143', and the patterned photoresist layer covers the partial conductive material layer 143' disposed on a sidewall of the memory unit 130 and the charge trapping structure 141. Then, taking the patterned photoresist layer as a mask, a non-isotropic etching process is conducted, so that the partial conductive material layer 143' disposed on another sidewall of the memory unit 130 is removed. During the etching, the partial charge trapping structure 141 disposed on the other sidewall is removed. The control gate 143 and the charge trapping structure 141 form a memory unit 140, and a charge trapping layer 141b included in the memory unit 140 serves for storing charges. Further, the memory unit 130 and the memory unit 140 form a memory cell 110. Afterwards, two source/drain regions 120a and 120b are formed at both sides of the memory cell 110, respectively. The dopant in the source/drain regions 120a and 120b is, for example, P-type dopant. The source/drain regions 120a and 120b are formed, for example, in a dopant implanting process. The formed non-volatile memory is a P-type channel memory.

According to the manufacturing method of the non-volatile memory, due to different etching selection ratios of the charge trapping structure 141 and the conductive material layer 143', the charge trapping structure 141 can be used as a self-alignment mask for removing the conductive material layer 143' on the memory unit 130, which results in an increasing process window. In addition, the process has simple steps, and a 2 bits/cell structure can be formed by combing the memory unit 130 and the memory unit 140 together. Therefore, the process has considerable value in the semiconductor industry.

An operating method of the non-volatile memory according to the present invention is further described hereafter. Referring to FIGS. 3A-3E, FIG. 3A is a diagram illustrating the programming operation of a left bit in a P-type channel memory; FIG. 3B is a diagram illustrating the programming operation of a right bit in a P-type channel memory; FIG. 3C is a diagram illustrating the reading operation of a left bit in a P-type channel memory; FIG. 3D is a diagram illustrating the reading operation of a right bit in a P-type channel memory; and FIG. 3E is a diagram illustrating the erasing operation of a P-type channel memory.

Figure 3A:
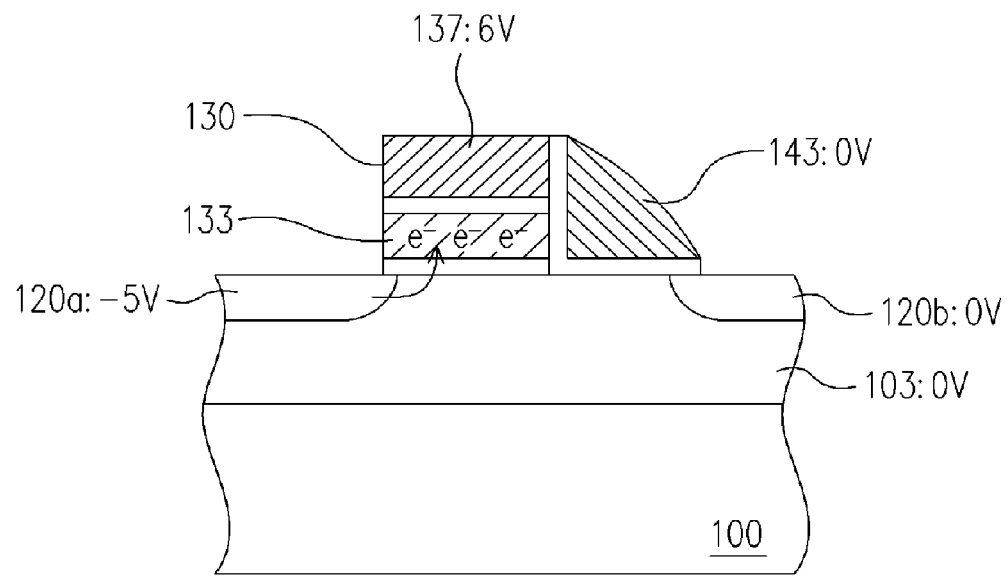
FIG. 3A is a diagram illustrating the programming operation of a left bit in a P-type channel memory.
Figure 3B:
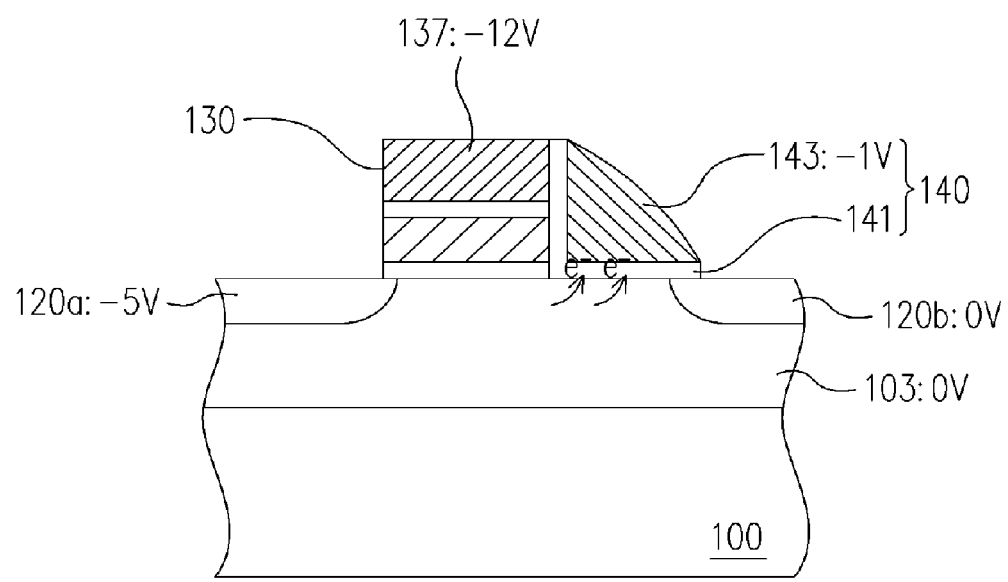
FIG. 3B is a diagram illustrating the programming operation of a right bit in a P-type channel memory.
Figure 3C:
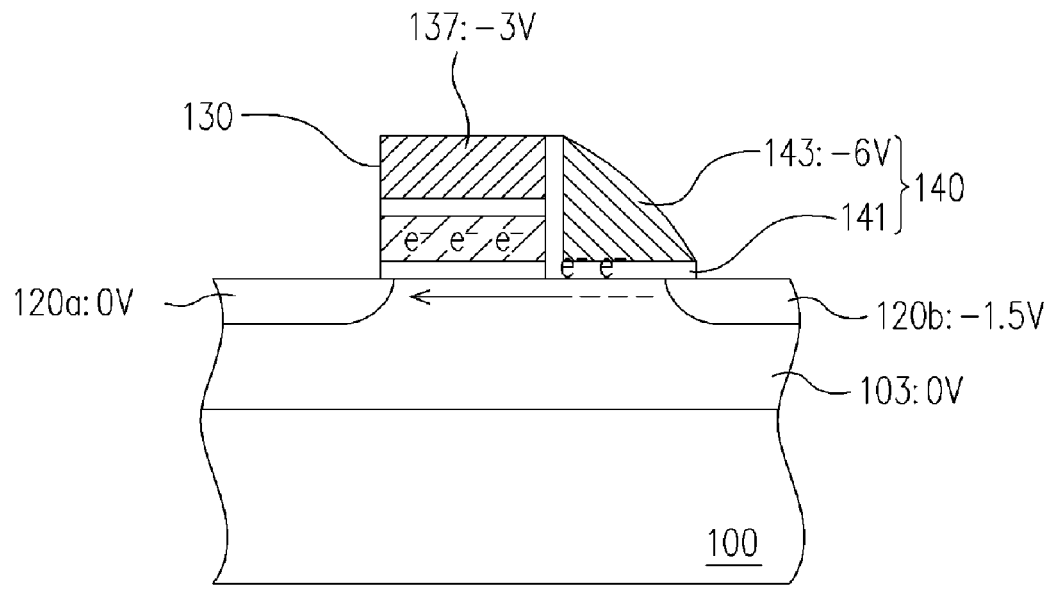
FIG. 3C is a diagram illustrating the reading operation of a left bit in a P-type channel memory.
Figure 3D:
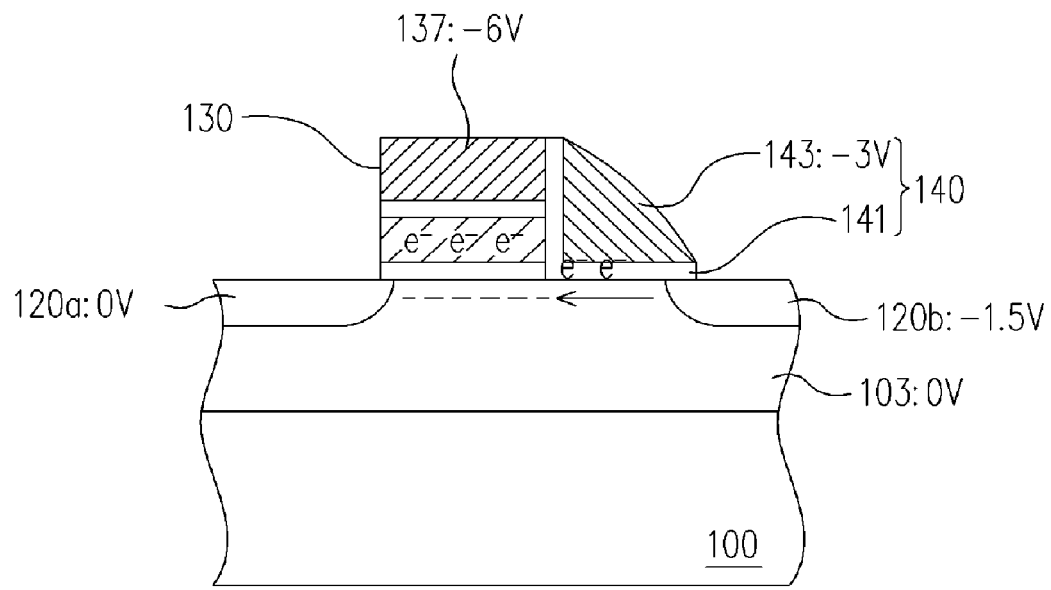
FIG. 3D is a diagram illustrating the reading operation of a right bit in a P-type channel memory.
Figure 3E:
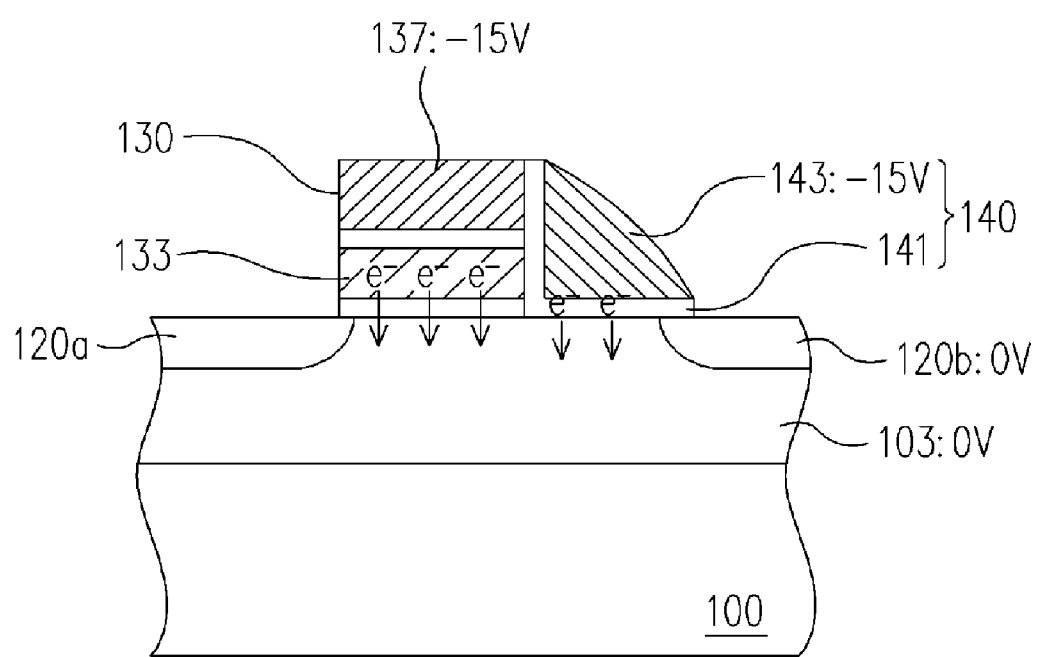
FIG. 3E is a diagram illustrating the erasing operation of a P-type channel memory.

Referring to FIG. 3A, during a programming operation, a voltage $V_{P1}$, for example, about −5V is applied to the source/drain region 120a, a voltage $V_{P2}$, for example, about 0V is applied to the source/drain region 120b, a voltage $V_{PG1}$, for example, about 6V is applied to the control gate 137, a voltage $V_{PC1}$, for example, about 0V is applied to the control gate 143 and a voltage $V_{NW}$, for example, about 0V is applied to the N-type well region 103. Wherein, the voltage $V_{PG1}$ of the control gate 137 is larger than the voltage $V_{P1}$ of the source/drain region 120a and the voltage $V_{P2}$ of the source/drain region 120b is larger than the voltage $V_{P1}$ of the source/drain region 120a, so that the band gap between valance band and conduction band is used to induce a hot-electron injection effect, by which the electrons are injected to the floating gate 133 of the memory unit 130 where a left bit is stored.

Referring to FIG. 3B, also during a programming operation, a voltage $V_{P1}$, for example, about −5V is applied to the source/drain region 120a, a voltage $V_{P2}$, for example, about 0V is applied to the source/drain region 120b, a voltage $V_{PG2}$, for example, about −12V is applied to the control gate 137, a voltage $V_{PC2}$, for example, about −1V is applied to the control gate 143 and a voltage $V_{NW}$, for example, about 0V is applied to the N-type well region 103. Wherein, the voltage $V_{PC2}$ of the control gate 143 is larger than the voltage $V_{P1}$ of the source/drain region 120a, the voltage $V_{P1}$ of the source/drain region 120a is larger than the voltage $V_{PG2}$ of the control gate 137 and the voltage $V_{P2}$ of the source/drain region 120b is larger than the voltage $V_{P1}$ of the source/drain region 120a, so that the channel hot-holes are used to induce hot-electron injection effect, by which the electrons are injected to the charge trapping layer 141 of the memory unit 140 where a right bit is stored.

Referring to FIG. 3C, during a reading operation, a voltage $V_{R1}$, for example, about 0V is applied to the source/drain region 120a, a voltage $V_{R2}$, for example, about −1.5V is applied to the source/drain region 120b, a voltage $V_{RG1}$, for example, about −3V is applied to the control gate 137, a voltage $V_{RC1}$, for example, about −6V is applied to the control gate 143 and a voltage $V_{NW}$, for example, about 0V is applied to the N-type well region 103. Wherein, the voltage $V_{RC1}$ of the control gate 143 is less than the voltage $V_{RG1}$ of the control gate 137, the voltage $V_{RG1}$ of the control gate 137 is less than the voltage $V_{R2}$ of the source/drain region 120b and the voltage $V_{R2}$ of the source/drain region 120b is less than the voltage $V_{R1}$ of the source/drain region 120a, so that a channel below the memory unit 140 is opened for reading the left bit in the memory unit 130.

Referring to FIG. 3D, also during a reading operation, a voltage $V_{R1}$, for example, about 0V is applied to the source/drain region 120a, a voltage $V_{R2}$, for example, about −1.5V is applied to the source/drain region 120b, a voltage $V_{RG2}$, for example, about −6V is applied to the control gate 137, a voltage $V_{RC2}$, for example, about −3V is applied to the control gate 143 and a voltage $V_{NW}$, for example, about 0V is applied to the N-type well region 103. Wherein, the voltage $V_{RG2}$ of the control gate 137 is less than the voltage $V_{RC2}$ of the control gate 143, the voltage $V_{RC2}$ of the control gate 143 is less than the voltage $V_{R2}$ of the source/drain region 120b and the voltage $V_{R2}$ of the source/drain region 120b is less than the voltage $V_{R1}$ of the source/drain region 120a, so that a channel below the memory unit 130 is opened for reading the right bit in the memory unit 140.

Referring to FIG. 3E, during an erasing operation, a voltage $V_{E2}$, for example, about 0V is applied to the source/drain region 120b, a voltage $V_{EG}$, for example, about −15V is applied to the control gate 137, a voltage $V_{EC}$, for example, about −15V is applied to the control gate 143 and a voltage $V_{NW}$, for example, about 0V is applied to the N-type well region 103. Wherein, both the voltage $V_{EG}$ of the control gate 137 and the voltage $V_{EC}$ of the control gate 143 are less than the voltage $V_{NW}$ of the N-type well region 103, so that a FN tunneling effect is used for inducing the electrons stored in the floating gate 133 of the memory unit 130 and the electrons stored in the charge trapping structure 141 of the memory unit 149 into the N-type well region 103. Thus, the left bit and the right bit previously stored in the memory unit 130 and the memory unit 140 respectively are erased.

According to the operating method of the non-volatile memory in the present invention, the band gap between valance band and conduction band is used to induce a hot-electron injection effect, by which the electrons are injected to the floating gate 133 of the memory unit 130; the channel hot-holes are used to induce hot-electron injection effect, by which the electrons are injected to the charge trapping layer 141 of the memory unit 140. These electron injection mechanisms feature a high efficiency, a faster speed to operate the non-volatile memory, a lower voltage required and power consumption.

From the above described, in the non-volatile memory of the present invention, two memory units are connected in series to each other, which not only enables a single memory cell to store 2-bits data, but also avoids the second bit effect problems in the prior art. In addition, the provided operating mode of the non-volatile memory features high efficiency, lower voltage required by programming operation on the memories, reduced power consumption and enhanced speed to operate the device. Therefore, the invention has a great value in the semiconductor industry.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A non-volatile memory, comprising:
   a substrate;
   a memory cell, disposed on the substrate, comprising:
     a first memory unit, from the substrate up, comprising at least a floating gate for storing charges and a first control gate;
     a second memory unit, disposed at one side of the first memory unit, and the second memory unit from the substrate up, comprising a charge tapping structure for storing charges and a second control gate; and
   a source/drain region, disposed in the substrate at both sides of the memory cell, wherein the first memory unit is adjacent to the second memory unit, and which are separated by the charge trapping structure.

2. The non-volatile memory of claim 1, wherein the charge tapping structure of the second memory unit having a charge trapping layer, and the charge trapping structure is disposed between the second control gate and the substrate and extending between the second control gate and the first memory unit.

3. The non-volatile memory of claim 2, wherein the charge trapping structure, from the substrate up, comprises a tunneling dielectric layer, the charge tapping layer and a barrier dielectric layer.

4. The non-volatile memory of claim 1, wherein the material of the charge tapping layer comprises silicon nitride.

5. The non-volatile memory of claim 1, further comprising a dielectric layer disposed between the floating gate and the substrate.

6. The non-volatile memory of claim 1, further comprising an inter-gate dielectric layer disposed between the first control gate and the floating gate.

7. The non-volatile memory of claim 6, wherein the material of the inter-gate dielectric layer comprises silicon oxide-silicon nitride-silicon oxide (ONO).

8. The non-volatile memory of claim 1, wherein the material of the floating gate comprises doped polysilicon.

9. The non-volatile memory of claim 1, wherein the material of the first control gate and the second control gate comprises doped polysilicon.

* * * * *